United States Patent [19]
Stalley

[11] 3,983,410
[45] Sept. 28, 1976

[54] CROSS-TALK REDUCTION IN SEMICONDUCTOR MEMORY DEVICE

[75] Inventor: Anthony Donald Stalley, Camberley, England

[73] Assignee: Quantel Limited, England

[22] Filed: June 2, 1975

[21] Appl. No.: 583,145

[30] Foreign Application Priority Data
June 6, 1974 United Kingdom............... 25076/74

[52] U.S. Cl. ........................ 307/221 R; 307/221 C; 307/224 R; 307/237; 307/208; 328/37; 328/37; 328/163; 328/166
[51] Int. Cl.² ..................... G11C 19/00; H03B 1/00; H03K 5/00
[58] Field of Search ........ 307/221 R, 221 C, 221 D, 307/223 R, 223 C, 224 R, 224 C, 282, 314, 208, 237, 203; 328/37, 163, 166, 165; 179/15 AN

[56] References Cited
UNITED STATES PATENTS

| | | | |
|---|---|---|---|
| 3,140,405 | 7/1964 | Kolling............................. | 307/203 |
| 3,290,653 | 12/1966 | Slattery et al...................... | 307/203 |
| 3,329,835 | 7/1967 | D'Agostino........................ | 307/203 |
| 3,714,460 | 1/1973 | Clemetson et al................. | 307/282 |

Primary Examiner—Stanley D. Miller, Jr.
Attorney, Agent, or Firm—Dowell & Dowell

[57] ABSTRACT

The memory circuit comprises a semiconductor shift register and means for effecting two phase clocking of the digital information through the shift register. Transformer means are provided for inducing a controlled amount of cross-talk in each of the two phases in the opposite sense to cross-talk generated by capacitive components present in the shift register whereby the induced cross-talk substantially cancels out the capacitive generated cross-talk.

5 Claims, 4 Drawing Figures

CROSS-TALK REDUCTION IN SEMICONDUCTOR MEMORY DEVICE

BACKGROUND TO THE INVENTION

This invention relates to the use of semiconductor memory devices for storing information in digital form, and more particularly to the problems encountered when MOS memory devices are used at high speed for the storage of television signals in digital form. In recent years, large scale integrated circuits have become available incorporating arrays of MOS transistors so as to form large numbers of memory cells.

In certain kinds of these storage devices, one or more terminals of each memory cell are connected together so that a common control is provided to a portion of the memory. The result of this common connection to a multiplicity of memory cells is that the device presents the total capacitive load at the control input, and a suitable drive amplifier must be provided to supply the necessary charging currents.

High speed MOS memory devices often employ demultiplexing techniques within the integrated circuit so as to enhance their performance, and more than one phase of control signal is then required. The integrated circuit MOS shift register is a device in this category, and two phase clocking of the digital information through the serially connected memory cells is a common practice. In this case, two drive amplifiers would provide the alternate charging currents to the two phase clock inputs of the device.

A problem arises however, in that a significant amount of capacitive cross coupling exists between the two phase clock inputs of the integrated circuit which interacts with the input capacitance of each phase. These capacitances effectively form a capacitive divider dependent on the ratio of the cross coupling capacitance to the input capacitance. This divider impresses an unwanted proportion of each clock drive waveform on to the other clock input. This impression of unwanted portions of the signals one on another is known as cross-talk and appears as transients on the input waveforms.

If clock drive amplifiers can be selected for operating the storage device which present driving impedances which are sufficiently low, then the capacitive cross-talk will be reduced. However, commercially available clock drive amplifiers do not satisfy this requirement and the amount of cross-talk which occurs between the clocking waveforms can far exceed the permissible operating limits of the MOS storage device. Maloperation in this way can lead to loss of stored data and/or damage to the storage device.

OBJECT OF THE INVENTION

An object of the invention is to provide a memory circuit with dual clock drive phases substantially free of cross-talk.

SUMMARY OF THE INVENTION

According to the invention we provide in a memory circuit comprising a semiconductor shift register and means for effecting two phase clocking of the digital information through said shift register; the provision of apparatus comprising transformer means for inducing a controlled amount of cross-talk in each of said two phases in the opposite sense to cross-talk generated by capacitive components present in said shift register whereby said induced cross-talk substantially cancels out said capacitive generated cross-talk.

BRIEF DESCRIPTION OF THE DRAWINGS

The invention will now be described by way of example with reference to the accompanying drawings, in which.

Figure 1:
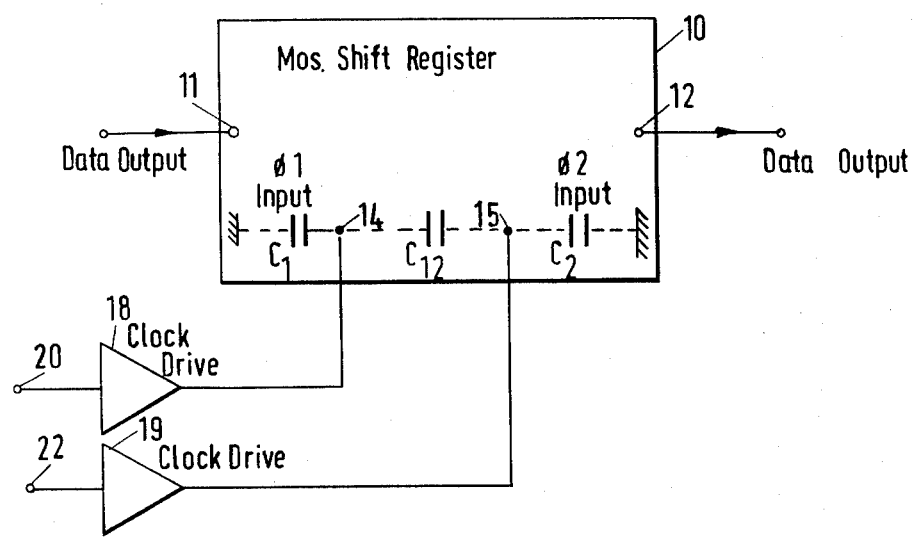
FIG. 1 shows a block diagram of the known memory circuit arrangement.

The known circuit arrangement shown in FIG. 1 comprises a MOS shift register 10 with a data input 11 and a data output 12. Serial data is fed into the register 10 and retrieved therefrom by means of clock pulses. The clock pulses are provided as two phases $\phi_1$ and $\phi_2$ and are applied to clock inputs 14 and 15 respectively of the register. Phase $\phi_1$ is derived from a clock drive amplifier 18 and phase $\phi_2$ from clock drive amplifier 19.

Figure 4:
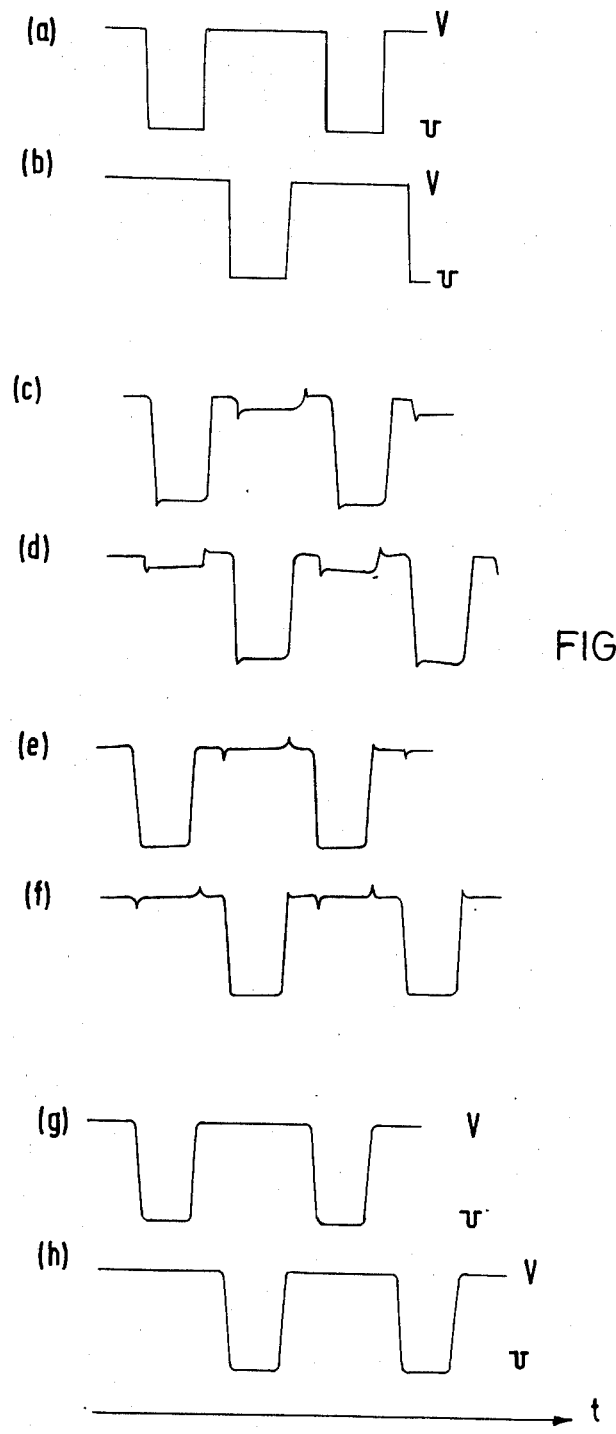
FIG. 4 shows clock drive waveforms produced by the circuits of FIGS. 1–3 compared with an idealised clock drive waveform.

The waveforms from the amplifiers 18 and 19 would be as shown in FIGS. 4($a$) and 4($b$) respectively if this circuit configuration was not affected by cross-talk as described above. Because of the inherent cross coupling $C_{12}$ and the input capacitances C1 and C2 of the register 10, the waveforms presented to the shift register are degraded to those shown in FIGS. 4($c$) and 4($d$).

Thus it can be seen by comparing the waveforms of FIGS. 4($a$) and 4($b$) with those of FIGS. 4($c$) and 4($d$), that unwanted transients are present on the latter waveforms which are due to cross-talk between input 14 and 15 due to the capacitive divider formed by capacitances C1, C2 and C12. In order to reduce this degradation in the waveforms, it is necessary to effectively reduce the capacitive components.

Figure 2:
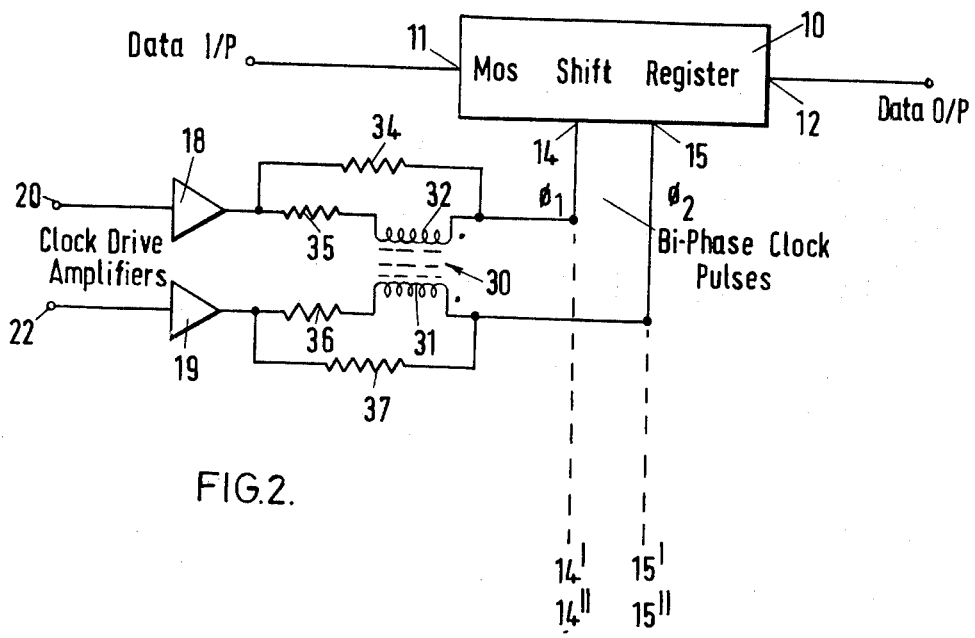
FIG. 2 shows one embodiment of the memory circuit according to the invention.

A substantial improvement in the waveform can be effected by using the circuit arrangement of FIG. 2.

A transformer 30 is provided between the clock drive amplifiers. Winding 32 of the transformer is connected with series resistance 35 to the clock drive amplifier 18. A resistor 34 is connected in parallel with the resistance 35 and winding 32.

Winding 31 of the transformer 30 is connected with series resistance 36 to the clock drive amplifier 19. A resistor 37 is connected in parallel with the resistance 36 and winding 31.

The windings 31 and 32 of the coupling transformer 30 must be connected in phase so that voltage induced in one winding by the shift register charging current induces a voltage of the same sense in the other winding, which opposes the capacitively coupled cross-talk between the clock lines. The sense of the windings is shown by the dot at the same end of each winding. The clock drive amplifiers may be arranged to supply bi-phase clock pulses to a plurality of MOS shift registers in parallel having respective clock inputs 14', 15' and 14'', 15'', etc. The bi-phase clock pulse waveforms are normally generated at standard logic levels using the well-known techniques and are applied to the amplifier input terminals 20 and 22. The clock drive amplifiers 18 and 19 amplify the bi-phase clock pulses and supply them at the levels required by the MOS shift registers.

The waveforms of FIG. 4 show the way in which the two phases of clock pulses alternate.

The circuit of FIG. 2 substantially reduces the amount of cross-talk as shown in the waveforms of FIGS. 4(e) and 4(f). The improvement however relates mainly to the lower frequency components. If positive going transients are still present these may be a source of damage to the MOS memory device. To keep the level of interference within the manufacter's specified limits for the device, the diode clipping circuit as shown in FIG. 3 is added.

Diode $D_1$ is connected with its anode to the $\phi_1$ phase of input 14. Diode $D_2$ is connected with its anode to the $\phi_2$ of input 15. The cathodes of diodes $D_1$ and $D_2$ are connected together and this point is fed to the emitter of transistor T1. The emitter of T1 is also connected in series with a resistor 40 to a voltage rail 43. The base of T1 is connected to the collector of a further transistor T2. The collector of T2 is also connected in series with resistor 41 to rail 42. The emitter of T2 is connected to rail 43 and the base to the junction of D1 and D2 cathodes. A supply voltage V is applied to rail 43. Thus transistors T1 and T2 are connected as a voltage stabilizer using the base emitter junction voltage of T2 as its reference. A low impedance voltage source is therefore maintained which is one semiconductor junction voltage less than the supply voltage V. Any positive going transitions on the clock waveforms $\phi_1$ and $\phi_2$ which would exceed the supply voltage V are substantially clamped by the diodes D1 and D2. Thus the waveforms produced are as shown in FIGS. 4(g) and 4(h) which are substantially free of cross-talk.

Figure 3:
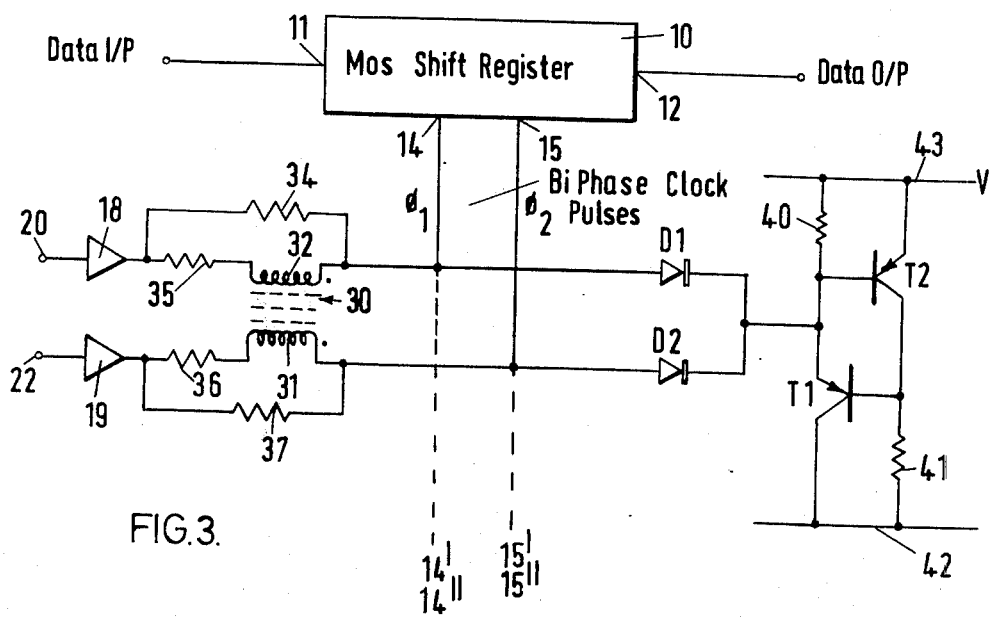
FIG. 3 shows a modification to the circuit of FIG 2.

It is not necessary to use the combined circuit of FIG. 3 for all applications, and there are cases where the arrangement of FIG. 2 will suffice without the addition of the diode clamping circuit. The transformer is effective in opposing both and negative going cross-talk, but the limits for allowable excursions in the positive direction are much tighter, so the residual positive going disturbances may have to be clamped by the addition of the diode circuit.

I claim:

1. In a memory circuit comprising a semiconductor shift register having first and second clock inputs and first and second clocking means connected with said clock inputs for effecting two phase clocking of the digital information through said shift register; the provision of apparatus comprising transformer means having a first winding connected in series with said first clocking means and said first clock input and a second winding connected in series with said second clock input, said windings being connected in phase with each other to induce a controlled amount of cross-talk in each of said two phases in the opposite sense to cross-talk generated by capacitive components present in said shift register whereby said induced cross-talk substantially cancels out said capacitive generated cross-talk.

2. Apparatus according to claim 1, wherein said transformer means includes resistance present in series with each said winding and a resistor connected in parallel with each said winding to determine the amount of induced cross-talk.

3. Apparatus according to claim 1, wherein limiting means are provided connected to the ends of the transformer windings coupled with the clock inputs to limit the voltages at the clock inputs of said register and thereby remove positive going transients from said clock inputs of said register due to cross-talk.

4. Apparatus according to claim 3, wherein said limiting means comprise semiconductor diodes connected to said transformer means.

5. Apparatus according to claim 4, wherein said limiting means includes a transisterised voltage stabilizer circuit connected to said diodes.

* * * * *